(12) United States Patent
Palm

(10) Patent No.: US 11,043,409 B2
(45) Date of Patent: Jun. 22, 2021

(54) METHOD OF FORMING CONTACTS TO AN EMBEDDED SEMICONDUCTOR DIE AND RELATED SEMICONDUCTOR PACKAGES

(71) Applicant: Infineon Technologies AG, Neubiberg (DE)

(72) Inventor: Petteri Palm, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 109 days.

(21) Appl. No.: 15/912,081

(22) Filed: Mar. 5, 2018

(65) Prior Publication Data

US 2019/0273017 A1  Sep. 5, 2019

(51) Int. Cl.
| | | |
|---|---|---|
| *H01L 21/56* | (2006.01) |
| *H01L 21/768* | (2006.01) |
| *H01L 23/31* | (2006.01) |
| *H01L 23/532* | (2006.01) |
| *H01L 23/522* | (2006.01) |

(52) U.S. Cl.
CPC ........ *H01L 21/76802* (2013.01); *H01L 21/56* (2013.01); *H01L 21/76877* (2013.01); *H01L 23/3114* (2013.01); *H01L 23/5226* (2013.01); *H01L 23/5329* (2013.01)

(58) Field of Classification Search
CPC ............... H01L 21/76802; H01L 21/56; H01L 21/76877
See application file for complete search history.

(56) References Cited

U.S. PATENT DOCUMENTS

| | | | |
|---|---|---|---|
| 7,170,153 B2 * | 1/2007 | Saga | H01L 21/561 257/678 |
| 7,767,495 B2 | 8/2010 | Fuergut et al. | |
| 2003/0034122 A1 | 2/2003 | Asai | |
| 2005/0179143 A1 * | 8/2005 | Moxham | H01L 23/13 257/782 |
| 2012/0289045 A1 | 11/2012 | Benwadih et al. | |
| 2019/0043734 A1 * | 2/2019 | Kapusta | H01L 23/16 |

FOREIGN PATENT DOCUMENTS

| | | |
|---|---|---|
| DE | 102011053099 A1 | 4/2012 |
| JP | H01200649 A | 8/1989 |
| WO | 2009087930 A1 | 7/2009 |

* cited by examiner

*Primary Examiner* — Hoa B Trinh
(74) *Attorney, Agent, or Firm* — Murphy, Bilak & Homiller, PLLC

(57) ABSTRACT

A method of forming contacts to an embedded semiconductor die includes embedding a semiconductor die in an encapsulation material, the semiconductor die having a first terminal at a first side of the semiconductor die, forming a first metal mask on a first surface of the encapsulation material, the first metal mask being positioned over the first side of the semiconductor die and exposing a first part of the encapsulation material aligned with the first terminal of the semiconductor die, directing a pressurized stream of liquid toward the first surface of the encapsulation material with the first metal mask, to remove the first exposed part of the encapsulation material and form a first contact opening to the first terminal of the semiconductor die, and forming an electrically conductive material in the first contact opening. Related semiconductor packages are also described.

17 Claims, 12 Drawing Sheets

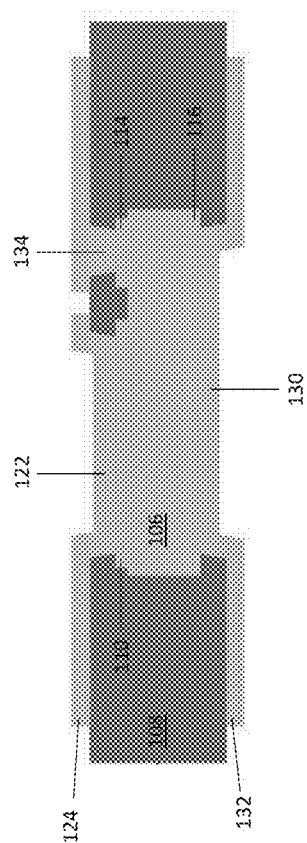

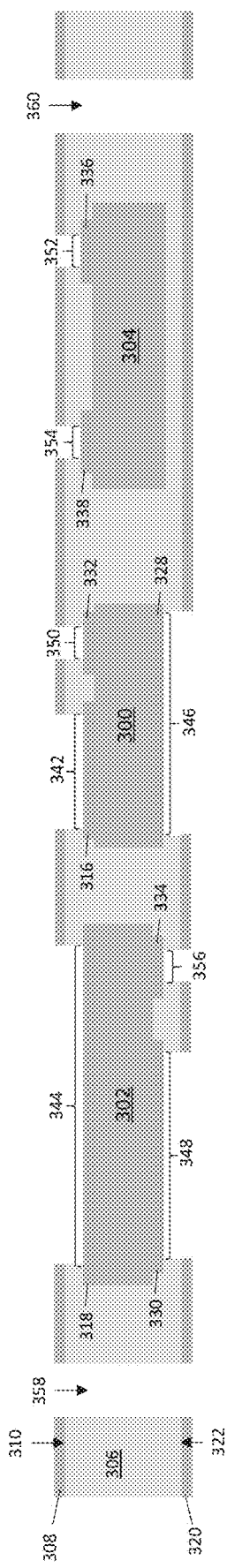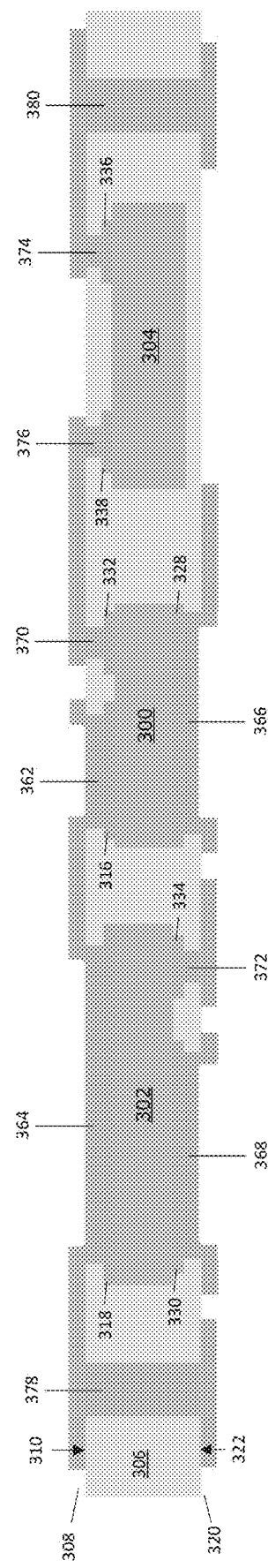
Figure 4C
Figure 4D

METHOD OF FORMING CONTACTS TO AN EMBEDDED SEMICONDUCTOR DIE AND RELATED SEMICONDUCTOR PACKAGES

BACKGROUND

Many types of semiconductor packages include one or more semiconductor dies embedded in an encapsulation material such as a non-conductive substrate of a printed circuit board (PCB). Each embedded semiconductor die has terminals for making electrical connection to the die. Contact openings are formed in the embedding encapsulation material to provide access to the die terminals. The contact openings are conventionally formed by laser drilling or plasma etching. With laser drilling, the size of the contact openings is restricted e.g. to diameters less than 140 µm, and therefore many contact openings (micro-vias in the case of laser drilling) are needed for each die terminal. In the case of a power semiconductor die with high current and thermal requirements, hundreds of micro-vias are typically needed for each power terminal of the die. Accordingly, the contact area and the area coverage is limited with laser drilling techniques even if a dense micro-via pattern is used. Also, because the micro-vias are drilled separately one-by-one, the processing time associated with laser drilling is lengthy (e.g. hours in the case of a production panel of semiconductor packages). Plasma etching removes only organic material, and therefore is not compatible with many types of common encapsulation materials used in semiconductor packages such as FR4 glass-reinforced epoxy laminate material. Hence, there is a need for an improved process of forming contact openings in semiconductor packages that include one or more semiconductor dies embedded in an encapsulation material.

SUMMARY

According to an embodiment of a method, the method comprises: embedding a semiconductor die in an encapsulation material, the semiconductor die having a first terminal at a first side of the semiconductor die; forming a first metal mask on a first surface of the encapsulation material, the first metal mask being positioned over the first side of the semiconductor die and exposing a first part of the encapsulation material aligned with the first terminal of the semiconductor die; directing a pressurized stream of liquid toward the first surface of the encapsulation material with the first metal mask, to remove the first exposed part of the encapsulation material and form a first contact opening to the first terminal of the semiconductor die; and forming an electrically conductive material in the first contact opening.

According to another embodiment of a method, the method comprises: embedding a plurality of semiconductor dies in a panel of encapsulation material, each semiconductor die having a first terminal at a first side of the semiconductor die; forming a first metal mask on a first surface of the panel of encapsulation material, the first metal mask being positioned over the first side of each semiconductor die and exposing first parts of the panel of encapsulation material aligned with the first terminals of the semiconductor dies; directing a pressurized stream of liquid toward the first surface of the panel of encapsulation material with the first metal mask, to remove the first exposed parts of the panel of encapsulation material and form first contact openings to the first terminals of the semiconductor dies; forming an electrically conductive material in the first contact openings; and singulating the panel of encapsulation material into individual semiconductor packages.

According to an embodiment of a semiconductor package, the semiconductor package comprises: an encapsulation material comprising glass fibres; a power semiconductor die embedded in the encapsulation material with glass fibres, the power semiconductor die having a first power terminal at a first side of the power semiconductor die; a first contact opening extending from a first surface of the encapsulation material with glass fibres to the first power terminal of the power semiconductor die, the first contact opening being the only contact opening to the first power terminal of the power semiconductor die; and a first metal via in the first contact opening.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIGS. 3A through 3E illustrate respective cross-sectional views of an embodiment of the liquid blasting process.

FIGS. 4A through 4D illustrate respective cross-sectional views of another embodiment of the liquid blasting process.

DETAILED DESCRIPTION

Embodiments described herein provide a liquid blasting process for manufacturing large-area contact openings in embedded semiconductor packages in less time and with lower cost compared to conventional laser drilling and plasma etching processes. The liquid blasting process allows for the manufacture of large-size contact openings to the terminals of a semiconductor die embedded in an encapsulation material in little time and without any additional process steps. A patterned metal interconnect layer provided on the surface of the encapsulation material can be used as a mask to form contact openings to some or all of the die terminals. The liquid blasting process removes unprotected regions of the encapsulation material to expose some or all of the terminals of each die embedded in the encapsulation material. An electrically conductive material is then formed in the contact openings to complete the electrical connections to each die. Both sides of the encapsulation material can be etched using the liquid blasting process, to form contact openings to terminals at opposite sides of a semiconductor die e.g. in the case of a vertical device and/or to enhance thermal performance of the package. Additives such as silicon oxide, silicon nitride, etc. can be added to the pressurized liquid stream to increase the effectiveness of the etching process.

Figure 1:
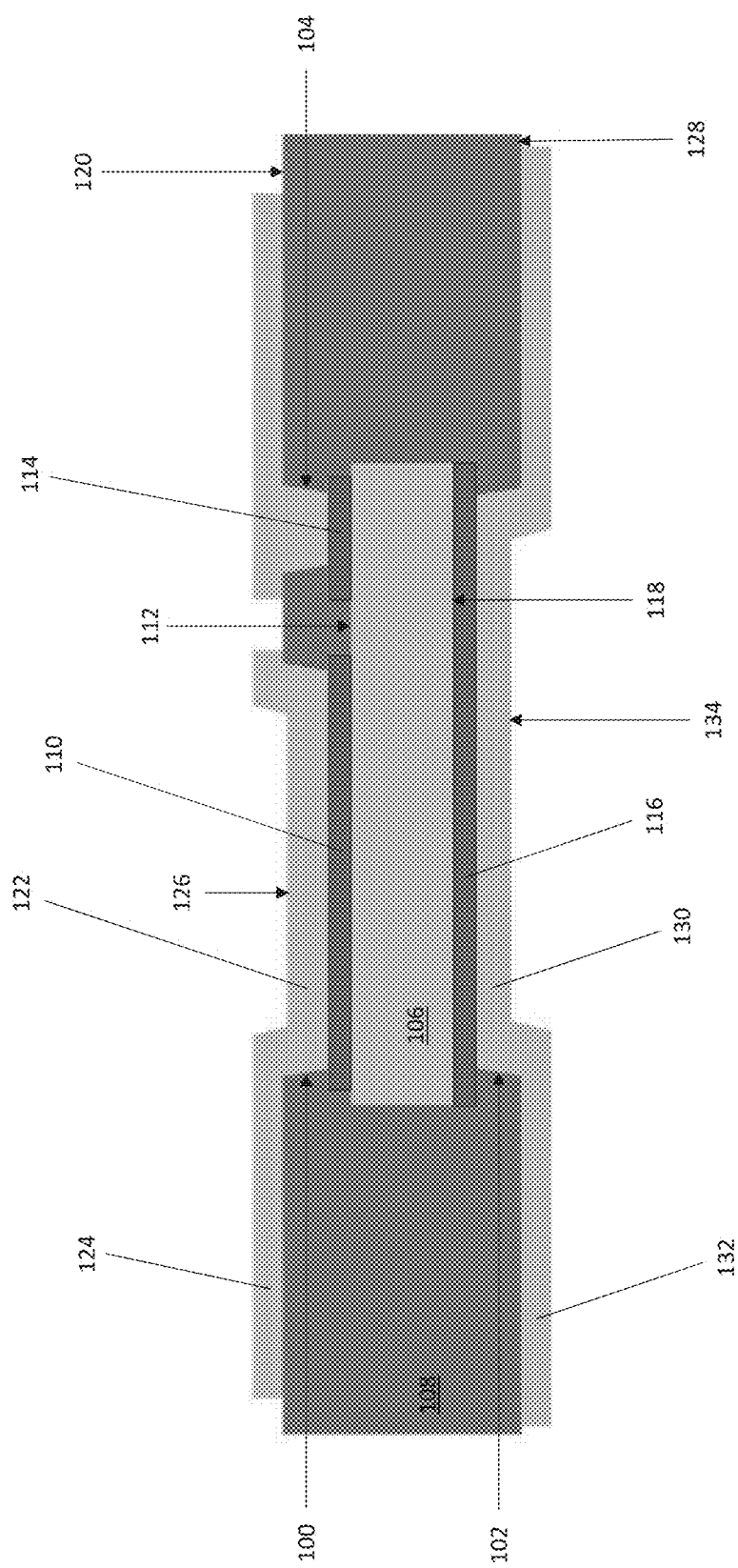
FIG. 1 illustrates a cross-sectional view of an embodiment of a discrete semiconductor package having contact openings formed using a liquid blasting process.

FIG. 1 illustrates an embodiment of a discrete semiconductor package having contact openings 100, 102, 104 formed using the liquid blasting process described herein. The discrete semiconductor package includes a power semiconductor die 106 such as a power MOSFET (metal-oxide-semiconductor field effect transistor), IGBT (insulated gate bipolar transistor), HEMT (high electron mobility transistor), JFET (junction field effect transistor), a power diode, etc. The power semiconductor die 106 is embedded in an encapsulation material 108 that comprises glass fibres. For example, the encapsulation material 108 can be an FR4 glass-reinforced epoxy laminate substrate of a PCB.

The power semiconductor die 106 has a first power terminal 110 at a first side 112 of the power semiconductor die 106. In the case of a power transistor die, the first power terminal 110 can be a source/emitter terminal, or instead a drain/collector terminal. In the case of a power diode die, the first power terminal 110 can be an anode or cathode terminal. In the case of a power transistor die, the first side 112 of the die 106 can also include a control (gate) terminal 114. In the case of a vertical power transistor device as shown in FIG. 1, the other power terminal (emitter/source or collector/drain) 116 of the power semiconductor die 106 is provided at a second side 118 of the die 106 opposite the first side 112. In the case of a vertical power diode, the other power terminal (cathode/anode) 116 is at the second side 118 of the die 106. In the case of a lateral power device, all terminals are at the same side 112/118 of the die 106. For a lateral device, even though all terminals are at the same side 112/118 of the die 106, the liquid blasting process described herein can be used to form an opening through the encapsulation material 108 at the side of the die 106 with no terminals, to provide a backside connection for thermal management.

A first wide contact opening 100 formed using the liquid blasting process described herein extends from a first (top) surface 120 of the encapsulation material 108 with glass fibres to the first power terminal 110 of the power semiconductor die 106. Because the size and shape of the first contact opening 100 is not limited by the liquid blasting process described herein, the first contact opening 100 can be the only contact opening to the first power terminal 110 of the power semiconductor die 106. A first metal via 122 is formed in the first contact opening 100 for providing an electrical connection to the first power terminal 110 of the die 106, through a patterned metal layer 124 formed on the first surface 120 of the encapsulation material 108 and used as a mask during the liquid blasting process to form the first contact opening 100.

Figure 2:
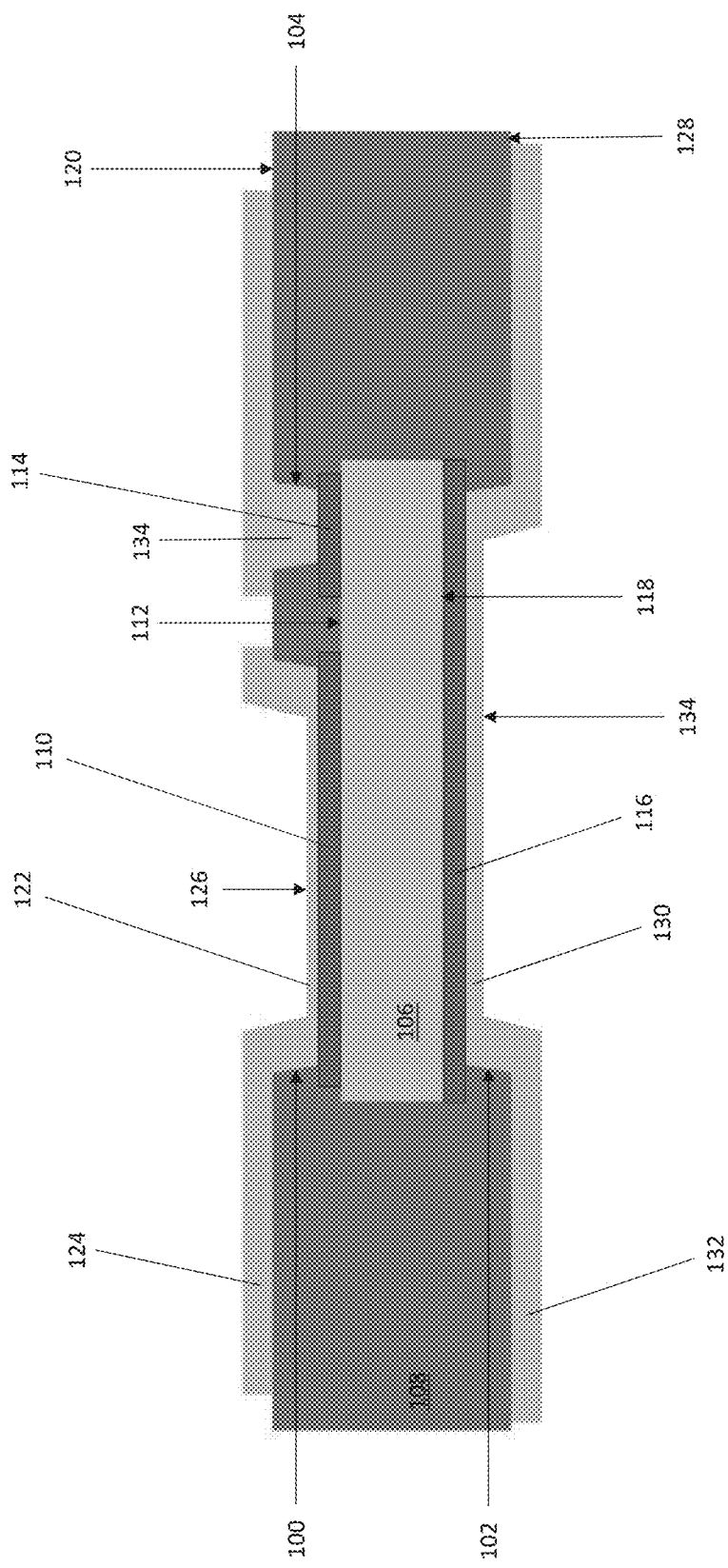
FIG. 2 illustrates a cross-sectional view of another embodiment of a discrete semiconductor package having contact openings formed using a liquid blasting process.

Depending on the size and/or shape of the first contact opening 100 and the process used to form the first metal via 122 (e.g. plating in the case of a copper via), the first metal via 122 may not completely fill the first contact opening 100 as shown in FIG. 2. That is, the top surface 126 of the first metal via 122 may terminate in a different plane than the top surface 120 of the encapsulation material 108.

In either case, a second wide contact opening 102 formed using the liquid blasting process described herein extends from a second (bottom) surface 128 of the encapsulation material 108 with glass fibres opposite the first (top) surface 120 to the second power terminal 116 of the power semiconductor die 106. Because the size and shape of the second contact opening 102 also is not limited by the liquid blasting process described herein, the second contact opening 102 can be the only contact opening to the second power terminal 116 of the power semiconductor die 106. A second metal via 130 is formed in the second contact opening 102 for providing an electrical connection to the second power terminal 116 of the die 106, through a patterned metal layer 132 formed on the second surface 128 of the encapsulation material 108 and used as a mask during the liquid blasting process to form the second contact opening 102.

Depending on the size and/or shape of the second contact opening 102 and the process used to form the second metal via 130 (e.g. plating in the case of a copper via), the second metal via 130 may not completely fill the second contact opening 102 as shown in FIG. 2. That is, the top surface 134 of the first metal via 122 may terminate in a different plane than the bottom surface 128 of the encapsulation material 108. In the case of a lateral power device, the second power terminal 102 would be disposed at the same side 112 of the die 106 as the first power terminal 110 and the second contact opening 102 would instead extend from the first (top) surface 120 of the encapsulation material 108 with glass fibres to the second power terminal 116.

Preferably, the contact openings 100, 102 maximize the exposed area of the respective power terminals 110, 116. In one embodiment, the first contact opening 100 exposes at least 80% of the area of the first power terminal 110 from the encapsulation material 108, and the second contact opening 102 exposes at least 80% of the area of the second power terminal 116 from the encapsulation material 108. For example, in the case of a 2mm×3mm die size, a maximum contact opening area compared to the drain terminal (pad) size can be about 80-85%. Other terminal/pad and contact opening areas are within the scope of the embodiments described herein, and the specific example given above should not be considered limiting and is provided for merely illustrative purposes. For example, in a multi-layer design, exposed drain and/or source terminal areas may be smaller than ideal due to layout reasons (e.g. the footprint may prevent contacting the entire drain and/or source terminal).

The contact opening 104 in the encapsulation material 108 and which extends to the control (gate) terminal 114 of the die 106 in the case of a power transistor device can be formed as part of the liquid blasting process used to form the wide contact opening 100 to the first power terminal 110. Since the control (gate) terminal 114 of the die 106 typically consumes significantly less area than the power terminals 110, 116, a different process can be used to form the control/gate contact opening 104. For example, laser drilling or plasma etching can be used to form the control/gate contact opening 104. However, a more cost-effective solution may be to form the control/gate contact opening 104 using the same liquid blasting process used to form the power terminal contact openings 100, 102. In either case, a metal via 136 fills the contact opening 104 in the encapsulation material 108 which extends to the control (gate) terminal 114 of the die 106, to complete an electrical connection between the control (gate) terminal 114 and a separate section of the patterned metal layer 124.

The semiconductor package shown in FIG. 1 is illustrated as a discrete package with a single power semiconductor die for ease of illustration only. In general, the liquid blasting process described herein can be used to form contact openings for any type of semiconductor package which includes one or more semiconductor dies embedded in an encapsulation material. The semiconductor dies can be power dies, logic dies, a combination of power and logic dies e.g. in the case of a half bridge or full bridge design, a power stage, a power converter, a POL (point of load) power supply, etc., or other types of semiconductor dies such as memory dies, sensor dies, MEMS (Microelectromechanical systems) dies, etc. The distinction between 'power' and 'logic' dies is meant to reflect differences in power/voltage requirements of power devices compared to other devices such as gate drivers, controllers, etc. The encapsulation material used to embed each semiconductor die can have one or more layers of (electrically) insulative material. The encapsulation material can be any standard insulative PCB material with or without glass fibers, a polymer film or stack of polymer films, any standard insulative eWLB (embedded wafer level ball grid array) material, molding resin, etc. The defining characteristics of the encapsulation material are: electrically insulative; etches at a faster rate than the mask used to form the contact openings in the encapsulation material using the liquid blasting process; and encapsulates one or more semiconductor dies.

FIGS. 3A through 3E illustrate an embodiment of the liquid blasting process, used to form the discrete semiconductor package shown in FIG. 1. As mentioned above, the liquid blasting process can be used to form contact openings for any type of semiconductor package which includes one or more semiconductor dies embedded in an encapsulation material. The embodiment shown in FIGS. 3A through 3E is provided as an exemplary process, and should not be construed as limiting based on the type of package and semiconductor die shown.

Figure 3A:
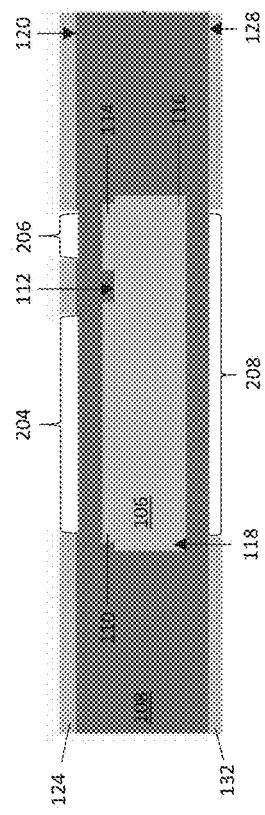

FIG. 3A shows the semiconductor die 106 embedded in the encapsulation material 108. A first metal layer 200 is formed on the first (top) surface 120 of the encapsulation material 108, and a second metal layer 202 is formed on the second (bottom) surface 128 of the encapsulation material 108. In the case of a multi-layer PCB as the encapsulation layer 108, the metal layers 200, 202 can be copper sheets laminated onto opposite sides 120, 128 of the encapsulation material 108.

Figure 3B:
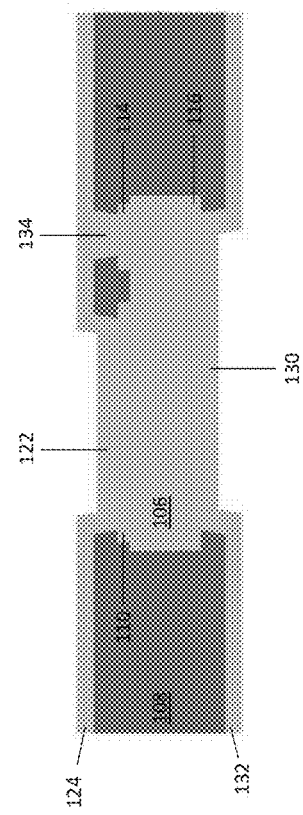

FIG. 3B shows the first metal layer 200 after being patterned to form the first metal mask 124 on the first (top) surface 120 of the encapsulation material 108. The first metal mask 124 is positioned over the first (top) side 112 of the semiconductor die 106, and exposes a part 204 of the encapsulation material 108 aligned with the first power terminal 110 of the semiconductor die 106. The first metal mask 124 exposes another part 206 of the encapsulation material 108 aligned with the control (gate) terminal 114 of the power semiconductor die 106.

The second metal layer 202 also has been patterned to form a second metal mask 132 on the second (bottom) surface 128 of the encapsulation material 108. The second metal mask 132 is positioned over the second (bottom) side 118 of the power semiconductor die 106, and exposes a part 208 of the encapsulation material 108 aligned with the second power terminal 116 of the power semiconductor die 106 at the bottom side 118 of the die 106. In the case of a lateral device, the second mask 132 can be omitted since all terminals would be at the same side of the die 106 and the first mask 124 could be patterned to form all contact openings to the die terminals. However, the second mask 132 can still be used for a lateral device during the liquid blasting process to form an opening through the encapsulation material 108 at the side of the die 106 with no terminals, to provide a backside connection for thermal management. Any standard lithography and etching processes can be used to form the mask(s) 124, 132. For example, LDI (laser direct imaging) or a photomask can be aligned using the same alignment marks used for die placement. The masks 124, 132 can instead be preformed and then applied to the encapsulation material 108.

Figure 3C:
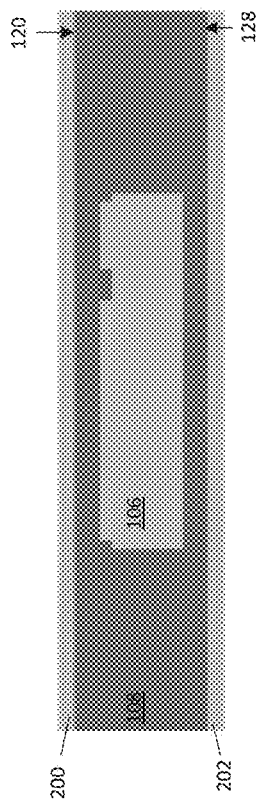

FIG. 3C shows a pressurized stream of liquid 210 directed toward the first surface 120 of the encapsulation material 108 with the first metal mask 124, and toward the second surface 128 of the encapsulation material 108 with the second metal mask 132. The pressurized stream of liquid 210 removes each exposed part 204, 206, 208 of the encapsulation material 108 and forms respective contact openings 100, 102, 104 to the terminals 110, 114, 116 of the power semiconductor die 106.

Water can be used as the pressurized stream of liquid 210. Other liquids can be used as well. In the case of copper as the masks 124, 132 and PCB as the encapsulation material 108, a removal rate of about 100 to 1 (PCB to copper) can be realized. Other removal rates can be achieved. The removal rate depends on several factors including the pressure of the liquid stream 210, the composition of the masks 124, 132, the composition of the encapsulation material 108, etc. Additives such as silicon oxide, silicon nitride, etc. can be added to the pressurized liquid stream 210 to increase the effectiveness of the etching process.

The pressurized stream of liquid 210 can be directed toward each surface 120, 128 of the encapsulation material 108 with a metal mask 124, 132 over multiple periods of time with intervening inspection intervals for determining if the terminals 110, 112, 114 of the power semiconductor die 106 are exposed. With this approach, the contact opening formation process has several runs. During each run, only a limited amount of each exposed part 204, 206, 208 of the encapsulation material 108 is removed which allows for the use of a low liquid pressure that does not damage the metal masks 124, 132 or the power semiconductor die 106. In another embodiment, the pressurized stream of liquid 210 is directed toward each surface 120, 128 of the encapsulation material 108 with a metal mask 124, 132 over an uninterrupted period of time. With this approach, the contact openings 100, 102, 104 are formed in a single run of the liquid blasting process at each side 120, 128 of the encapsulation material 108. The uninterrupted period of time is selected to account for the thickness of the encapsulation material 108 over each side 112, 118 of the power semiconductor die 106 with a terminal 110, 112, 114 plus tolerance, to ensure that the die terminals 110, 112, 114 are exposed by the liquid blasting process even though only a single run is performed. In addition or alternatively, each surface 120, 128 of the encapsulation material 108 subjected to the liquid blasting process can be inspected to determine when the terminals 110, 112, 114 of the power semiconductor die 106 are exposed. According to this embodiment, the liquid blasting process terminates when all die terminals 110, 112, 114 are visually detected.

Figure 3D:
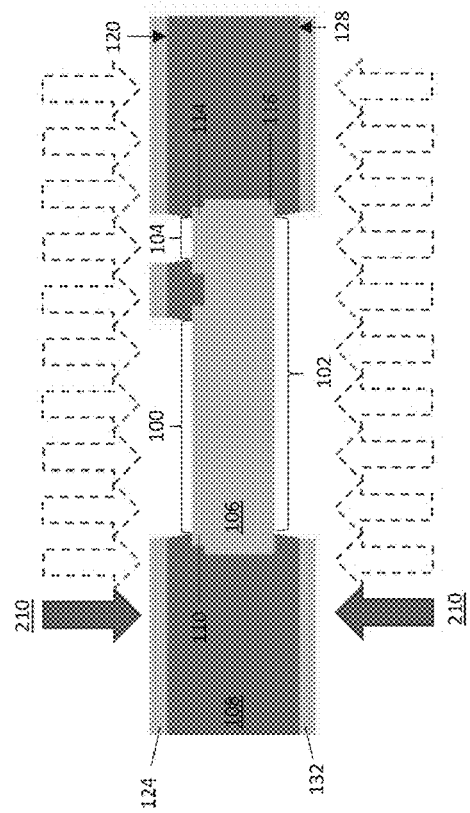

FIG. 3D shows the package after an electrically conductive material is formed in the contact openings 100, 102, 104 formed by the pressurized stream of liquid 210. In the case of copper as the electrically conductive material, the copper can be plated. Copper plating typically has several process steps, such as electroless seed layer plating, electrochemical plating, bridging and via filling. After plating, the copper layer is structured as shown in FIG. 3E e.g. using standard photolithography and etching processes. The resulting metal vias 122, 130, 134 may completely fill some or all of the contact openings 100, 102, 104 e.g. as shown in FIG. 1, or partly fill some or all of the contact openings 100, 102, 104 e.g. as shown in FIG. 2. In general, any standard metal deposition/plating/patterning process can be used to form the metal vias.

Each respective metal via 122, 130, 134 completes an electrical connection between the corresponding terminal 110, 114, 116 of the power semiconductor die 106 and a separate section of the patterned metal layers 124, 132. That is, according to this embodiment, the masks 124, 132 used during the liquid blasting process also form a patterned metal interconnect layers.

FIGS. 4A through 4D illustrate another embodiment of the liquid blasting process, used to form a multi-die semiconductor package. The multi-die semiconductor package provides an integrated half bridge solution e.g. as part of a power stage, POL power supply, or power converter. The multi-die semiconductor package includes a high-side power transistor die 300, a low-side power transistor die 302 and a driver (logic) die 304 for driving the control terminals of the power transistor dies 300, 302.

Figure 4A:
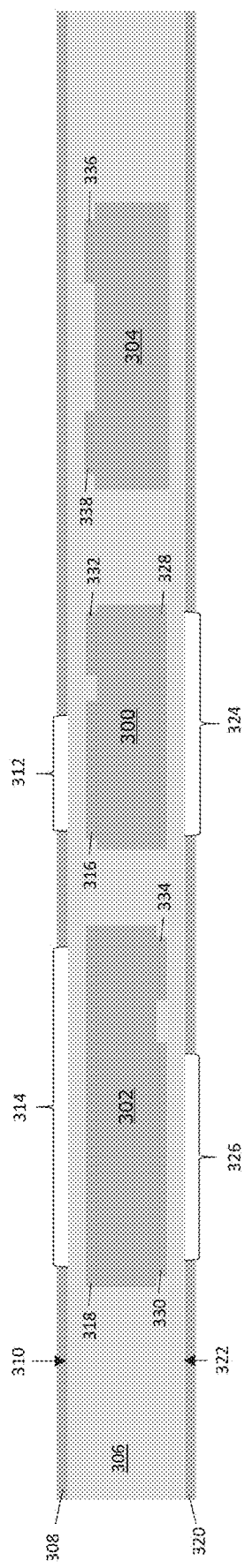

FIG. 4A shows the semiconductor dies 300, 302, 304 embedded in an encapsulation material 306. A first metal mask 308 is formed on the first (top) surface 310 of the encapsulation material 306. The first metal mask 308 has openings which expose parts 312, 314 of the encapsulation material 306 aligned with first power terminals 316, 318 at a first (top) side of the power semiconductor dies 300, 302. A second metal mask 310 is formed on the second (bottom) surface 322 of the encapsulation material 306. The second metal mask 320 has openings which expose parts 324, 326 of the encapsulation material 306 aligned with second power terminals 328, 330 at a second (bottom) side of the power semiconductor dies 300, 302. Control terminals 332, 334 of the power semiconductor dies 300, 302 and all terminals 336, 338 of the driver (logic) die 304 remain covered by the respective metal masks 308, 320 in FIG. 4A according to this embodiment.

Figure 4B:
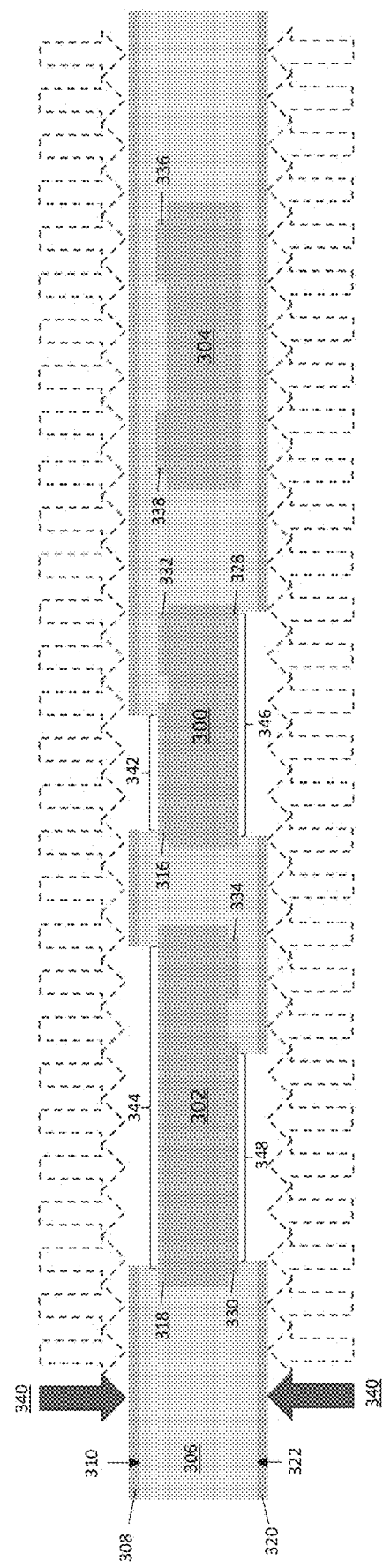

FIG. 4B shows a pressurized stream of liquid 340 such as water with or without additives such as silicon oxide, silicon nitride, etc. directed toward the first surface 310 of the encapsulation material 306 with the first metal mask 308, and toward the second surface 322 of the encapsulation material 306 with the second metal mask 320. The pressurized stream of liquid 340 removes each exposed part 312, 314, 324, 326 of the encapsulation material 306 and forms respective contact openings 342, 344, 346, 348 to the power terminals 316, 318, 328, 330 of each power semiconductor die 300, 302. One or more runs of the liquid blasting process can be performed with or without visual inspection to form the contact openings 342, 344, 346, 348, as previously described herein.

FIG. 4C shows the multi-die package after a standard laser drilling process in which additional contact openings 350, 352, 354 are laser drilled into the first (top) surface 310 of the encapsulation material 306 to expose the control terminal 332 of the high-side power semiconductor die 300 and the terminals 336, 338 of the driver semiconductor die 304, which is shown as a lateral device but instead could be a vertical device. The laser drilling process also is used to form one or more additional contact openings 356 in the second (bottom) surface 322 of the encapsulation material 306 to expose the control terminal 334 of the low-side power semiconductor die 302, and to form openings 358, 360 which extend completely through the encapsulation material 306 outside the region of the dies 300, 302, 304.

FIG. 4D shows the multi-die package after an electrically conductive material is formed in the contact openings 342-356 in the encapsulation material 306. In the case of copper as the electrically conductive material, copper can be plated as previously described herein. The copper can then be patterned using a standard structuring process to form respective metal vias 362-376 that completely or partly fill the wide contact openings 342-348 formed by the liquid blasting process, and that completely fill the narrower contact openings 350-356 formed by the laser drilling process. In general, any standard metal deposition/plating/patterning process can be used to form the metal vias 362-376. The electrically conductive material also forms through-substrate vias 378, 380 which fill the openings 358, 360 that extend completely through the encapsulation material 306 outside the region of the dies 300, 302, 304.

Figure 5A:
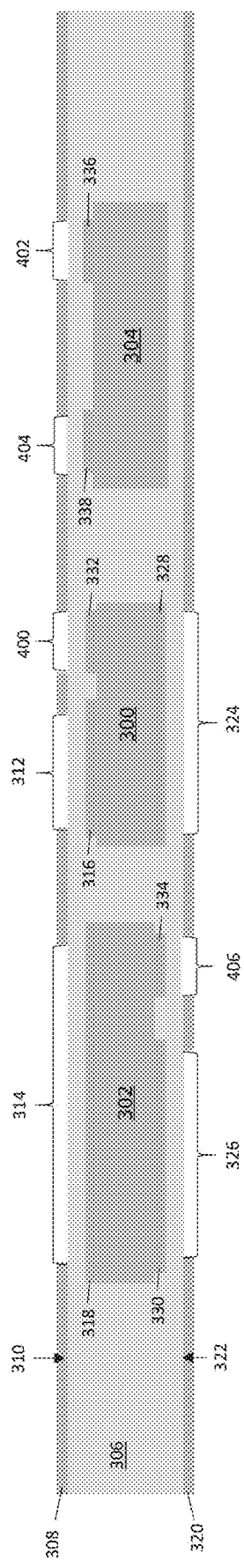
FIGS. 5A through 5C illustrate respective cross-sectional views of yet another embodiment of the liquid blasting process.
Figure 5B:
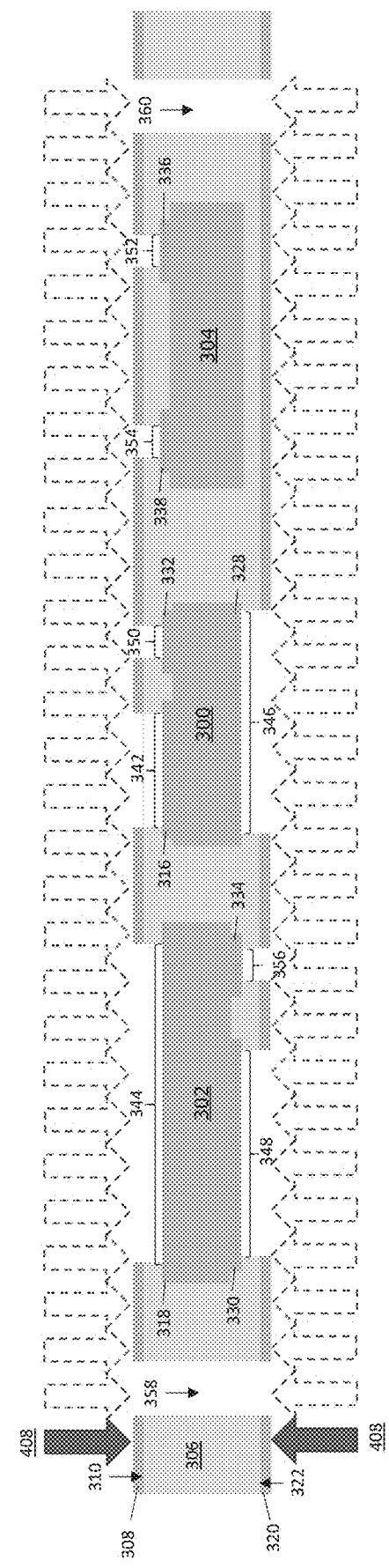
Figure 5C:
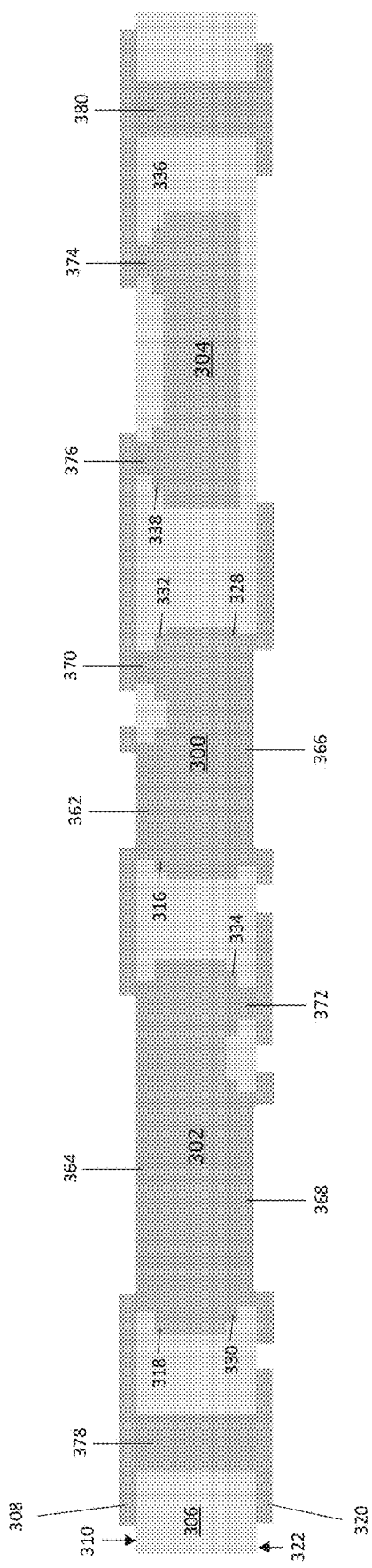

FIGS. 5A through 5C illustrate yet another embodiment of the liquid blasting process, used to form a multi-die semiconductor package. The embodiment shown in FIGS. 5A through 5C is similar to the embodiment shown in FIGS. 4A through 4D. Different, however, laser drilling is not used to form any contact openings or through-vias in the encapsulation material 306. Instead, the liquid blasting process is used to form the contact openings 342-356 to all of the die terminals 316, 318, 328, 330, 332, 334, 336, 338 and to form the openings 358, 360 which extend completely through the encapsulation material 306 outside the region of the dies 300, 302, 304.

FIG. 5A shows the semiconductor dies 300, 302, 304 embedded in the encapsulation material 306. The first metal mask 308 is formed on the first (top) surface 310 of the encapsulation material 306, and has openings which expose parts 312, 314 of the encapsulation material 306 aligned with the first power terminals 316, 318 at a first (top) side of the power semiconductor dies 300, 302. The first metal mask 308 has additional openings which expose additional parts 400, 402, 404 of the encapsulation material 306 aligned with the control (gate) terminal 332 of the high-side power semiconductor die 300 and the terminals 336, 338 of the driver semiconductor die 304. The second metal mask 320 is formed on the second (bottom) surface 322 of the encapsulation material 306, and has openings which expose parts 324, 326 of the encapsulation material 306 aligned with the second power terminals 328, 330 at a second (bottom) side of the power semiconductor dies 300, 302. The second metal mask 320 has additional openings which expose an additional part 406 of the encapsulation material 306 aligned with the control (gate) terminal 334 of the low-side power semiconductor die 302 at the second (bottom) surface 322 of the encapsulation material 306.

FIG. 5B shows a pressurized stream of liquid 408 such as water with or without additives such as silicon oxide, silicon nitride, etc. directed toward the first surface 310 of the encapsulation material 306 with the first metal mask 308, and toward the second surface 322 of the encapsulation material 306 with the second metal mask 320. The pressurized stream of liquid 408 removes each exposed part 312, 314, 324, 326, 400, 402, 404, 406 of the encapsulation material 306 and forms all contact openings 342-356 to the terminals 316, 318, 328, 330, 332, 334, 336, 338 of the semiconductor dies 300, 302, 304. Openings 358, 360 which extend completely through the encapsulation material 306 outside the region of the dies 300, 302, 304 can all be formed by the pressurized stream of liquid 408, if the masks 308, 320 are patterned with corresponding openings. One or more runs of the liquid blasting process can be performed with or without visual inspection to form the openings 342-360, as previously described herein.

FIG. 5C shows the multi-die package after an electrically conductive material is formed in the openings 342-360 in the encapsulation material 306. In the case of copper as the electrically conductive material, copper can be plated as previously described herein. The copper can then be patterned using a standard structuring process to form the metal vias 362-380 that completely or partly fill the openings 342-360 formed by the liquid blasting process. In general, any standard metal deposition/plating/patterning process can be used to form the metal vias 362-380.

Figure 6B:
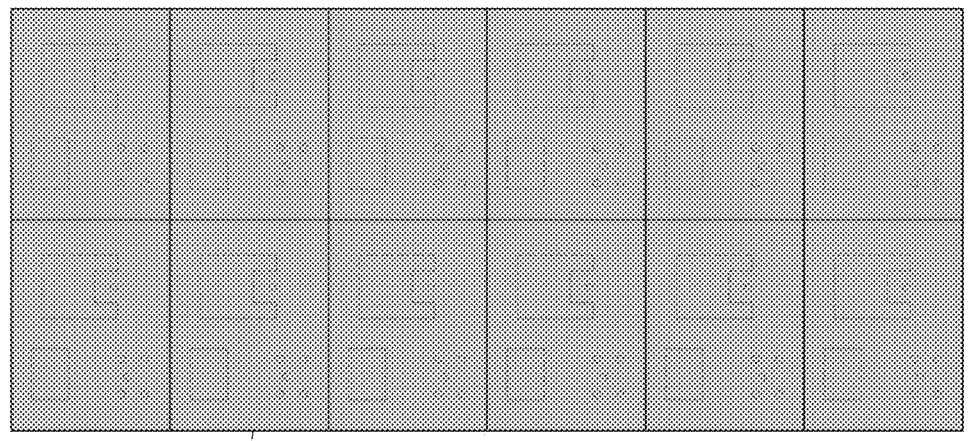
FIGS. 6A and 6B illustrate respective plan views of an embodiment of the liquid blasting process, used in package panel production.
Figure 6A:
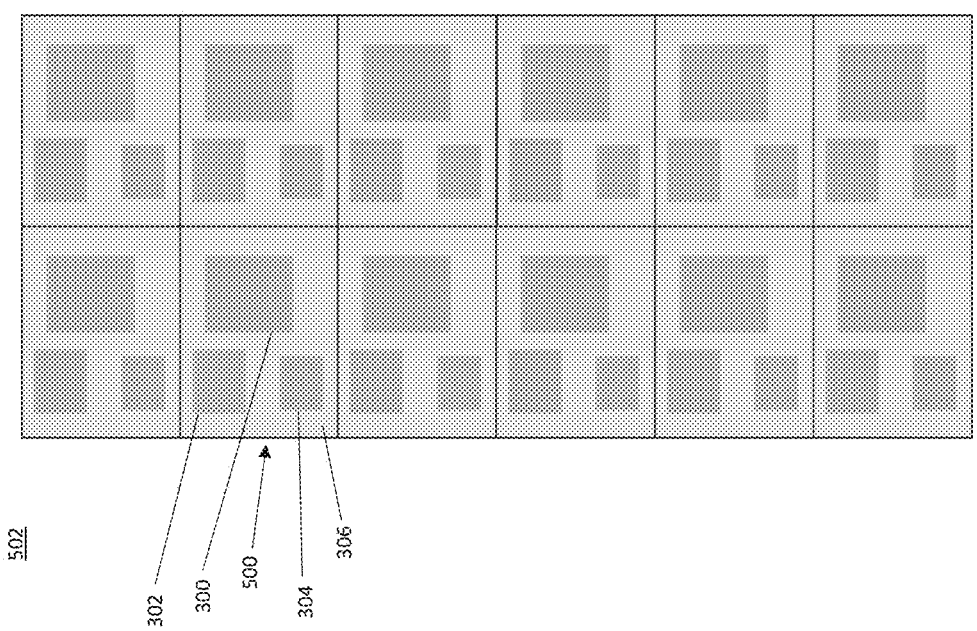

FIGS. 6A and 6B illustrate still another embodiment of the liquid blasting process, used to form a plurality multi-die semiconductor packages 500 from a production panel 502 of such packages. FIGS. 6A and 6B show the same type of multi-die semiconductor package as shown in FIGS. 4A through 4D and in FIGS. 5A through 5C, but processed as a panel 502 of semiconductor packages 500. According to this embodiment, groups of semiconductor dies 300/302/304 are embedded in a panel of encapsulation material 306. Each group of semiconductor dies 300/302/304 corresponds to the multi-die semiconductor package shown in FIGS. 4A through 4D and in FIGS. 5A through 5C.

FIG. 6A shows each group of semiconductor dies 300/302/304 partly embedded in the panel of encapsulation material 306, e.g. a multi-layer PCB panel.

FIG. 6B shows the production panel 502 after each group of semiconductor dies 300/302/304 is fully embedded in the panel of encapsulation material 306, and after a metal layer 504 such as a copper foil is formed on each main surface of the panel of encapsulation material 306. The shapes with dashed lines shown in FIG. 6B indicate the regions of the metal layer 504 to be removed to form a mask exposing the underlying parts of the panel of encapsulation material 306 which are aligned with the terminals of each group of semiconductor dies 300/302/304, as previously described herein. The exposed parts of the panel of encapsulation material 306 are then removed by directing a pressurized stream of liquid toward each surface of the panel of encapsulation material 306 with a metal mask, eventually exposing the die terminals. Electrical connections are then made to the exposed terminals, also as previously described herein. The liquid blasting process can be used to form contact openings to only the power terminals of the power semiconductor dies 300, 302 which carry high current, e.g. as shown in FIGS. 4A through 4D, or to form the contact openings to all die terminals (and possibly through-via openings between the dies), e.g. as shown in FIGS. 5A through 5C. In either case, at least the power terminals of the power semiconductor dies 300, 302 have wider contact openings as compared to what can be provided by conventional laser drilling.

Figure 7:
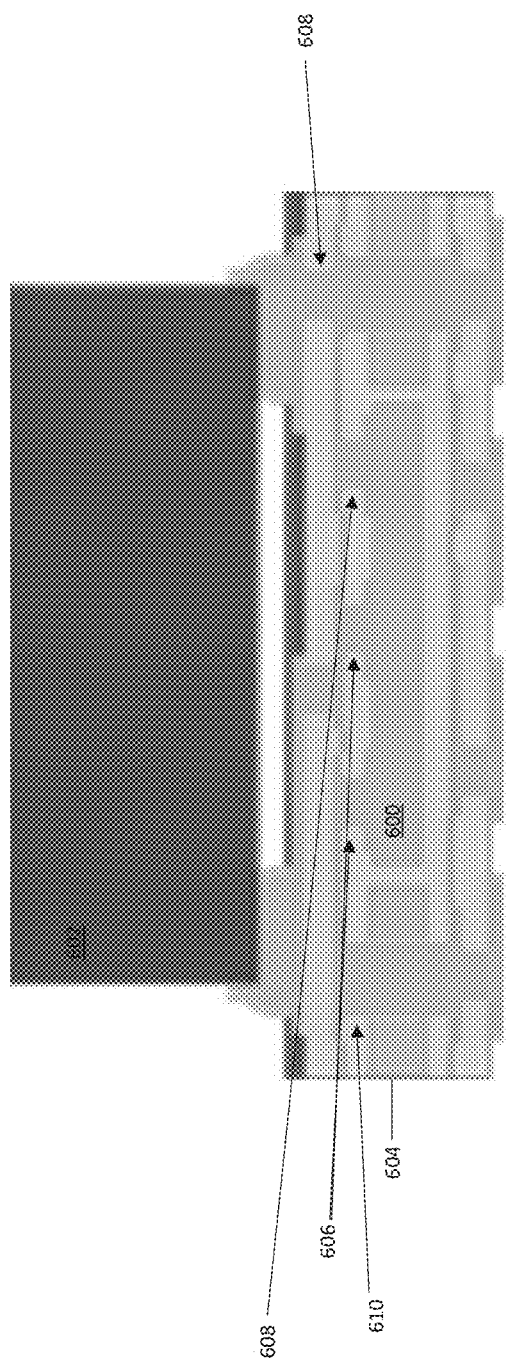
FIG. 7 illustrates a cross-sectional view of an embodiment of a POL (point of load) semiconductor package having contact openings formed using a liquid blasting process.

FIG. 7 illustrates an embodiment of a POL semiconductor package having contact openings formed using the liquid blasting process described herein. The POL semiconductor package includes at least one power semiconductor die 600 and an inductor 602 attached to the top side of an encapsulation material 604 in which the die 600 is embedded. Contact openings 606 to the power terminals of each power semiconductor die 600 included in the POL package are formed by the liquid blasting process described herein. Other contact openings 608 e.g. to a control terminal of each die 600 and/or any openings 610 which extend completely through the encapsulation material 604 in a region outside each semiconductor die 600 can also be produced by the liquid blasting process described herein, or instead by another process such as standard laser drilling. At least the contact openings 606 to the power terminals of each power semiconductor die 600 are formed by the liquid blasting process.

Figure 8:
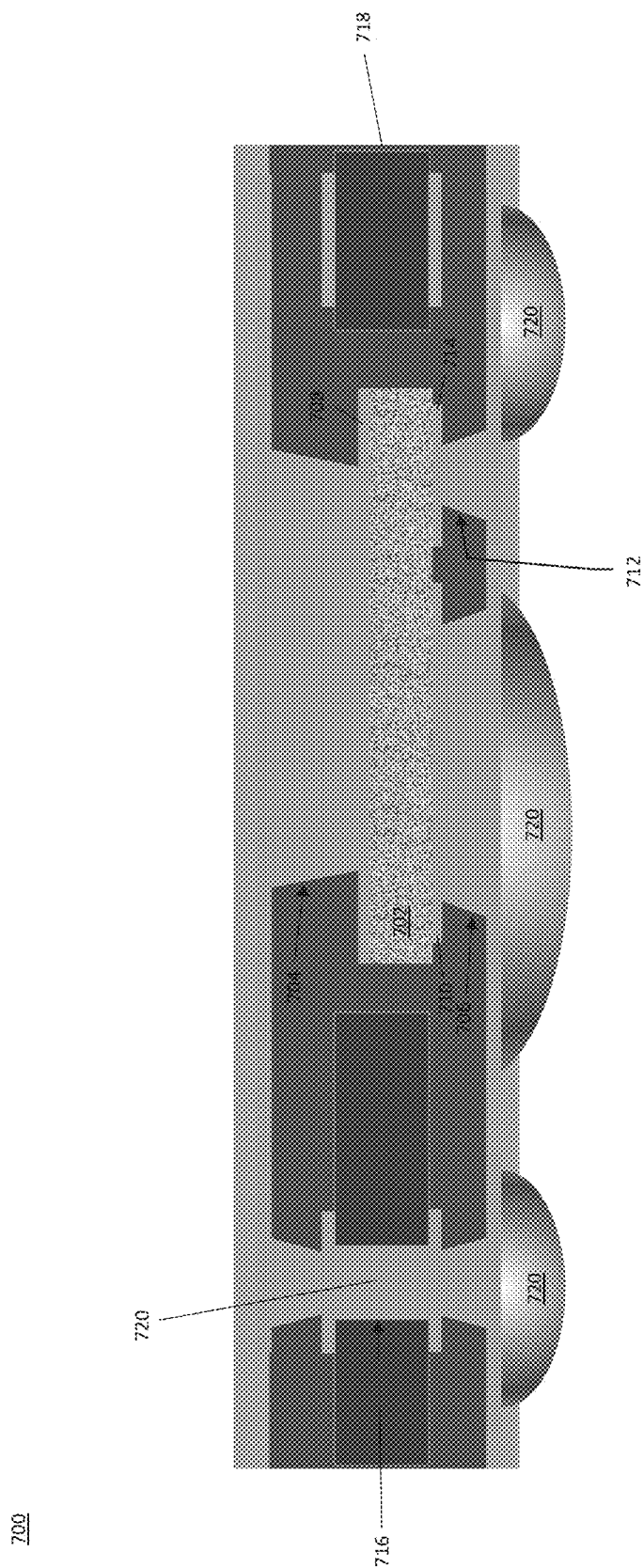
FIG. 8 illustrates a cross-sectional view of an embodiment of a single-die, multi-die or SIP (system in package) semiconductor package having contact openings formed using a liquid blasting process described herein.

FIG. 8 illustrates an embodiment of a single-die, multi-die or SIP (system in package) semiconductor package 700 having contact openings formed using the liquid blasting process described herein. The semiconductor package 700 includes at least one power semiconductor die 702. Contact openings 704, 706 to the power terminals 708, 710 of each power semiconductor die 702 included in the package 700 are formed by the liquid blasting process described herein. Other contact openings 712 e.g. to a control terminal 714 of each die 702 and/or any openings 716 which extend completely through the encapsulation material 718 in a region outside each semiconductor die 702 e.g. to form a through-substrate conductive via 720 can also be produced by the liquid blasting process described herein, or instead by another process such as standard laser drilling. The through-substrate conductive via 720 allows all electrical connections to be brought out at one side of the package 700. At least the contact openings 704, 706 to the power terminals 708, 710 of each power semiconductor die 702 are formed by the liquid blasting process. The semiconductor package 700 is shown with solder bumps 720 for attachment to another substrate such as a PCB.

Figure 9:
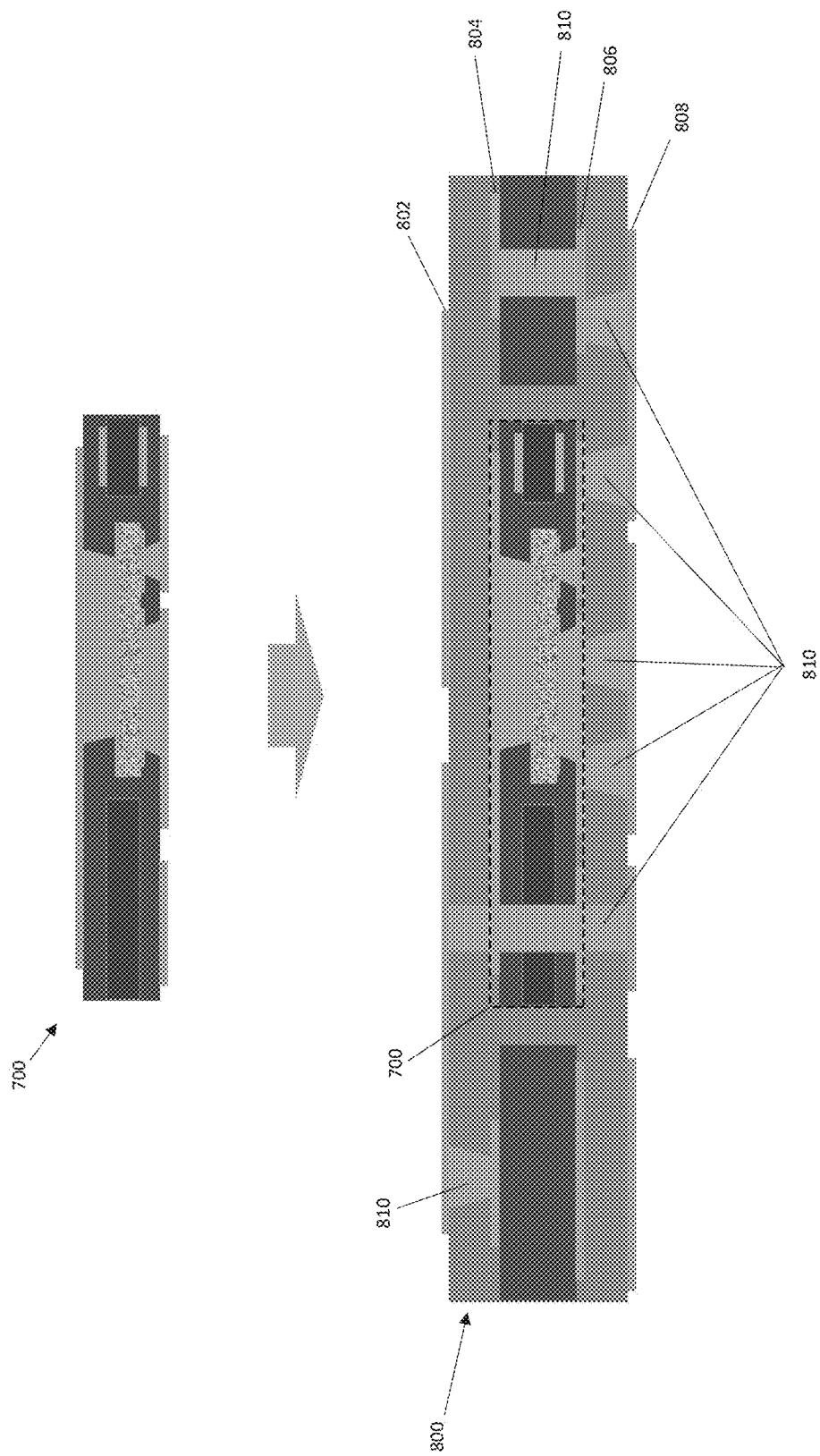
FIG. 9 illustrates a cross-sectional view of an embodiment of a system-in-board package for embedding in a PCB mother board, the system-in-board package having contact openings formed using a liquid blasting process.

FIG. 9 illustrates an embodiment of the package 700 shown in FIG. 8 configured as a system-in-board package for embedding in a PCB mother board 800. The system-in-board package 700 has contact openings formed using the liquid blasting process described herein, as explained above in connection with FIG. 8. The system-in-board package 700 is embedded in the PCB mother board 800, as indicated by the downward facing arrow in FIG. 8. The PCB mother board 800 can have patterned conductive layers 802, 804, 806, 808 and corresponding conductive vias 810 for forming electrical connections to the embedded system-in-board package 700. Openings can be formed in the PCB mother board 800 by the liquid blasting process described herein to accommodate the conductive vias 804, or instead can be formed by another process such as standard laser drilling.

As mentioned above, the liquid blasting process described herein can be used to form contact openings for any type of semiconductor package which includes one or more semiconductor dies embedded in an encapsulation material. The liquid blasting process can be used to form the contact openings to just the power terminals of an embedded die, or to all die terminals. In the case of a lateral device where all terminals are at one side of the die, the liquid blasting process described herein can be used to form an opening through the encapsulation material at the side of the die with no terminals, to provide a backside connection for thermal management. The liquid blasting process described herein also can be used to form one or more openings which extend completely through the encapsulation material in a region outside each semiconductor die, e.g. so that through-vias can be formed in these opening(s) which extend from one major surface of the encapsulation material to the opposite main surface.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method, comprising:
    embedding a semiconductor die in an encapsulation material, the semiconductor die being a power semiconductor die and having a first terminal at a first side of the semiconductor die;
    forming a first metal mask on a first surface of the encapsulation material, the first metal mask being positioned over the first side of the semiconductor die and exposing a first part of the encapsulation material aligned with the first terminal of the semiconductor die;
    directing a pressurized stream of liquid toward the first surface of the encapsulation material with the first metal mask, to remove the first exposed part of the encapsulation material and form a first contact opening to the first terminal of the semiconductor die;
    forming an electrically conductive material in the first contact opening;
    embedding a logic semiconductor die in the encapsulation material, the logic semiconductor die configured to drive or control the power semiconductor die,
    wherein the first metal mask exposes an additional part of the encapsulation material aligned with the logic semiconductor die,
    wherein the pressurized stream of liquid directed toward the first surface of the encapsulation material with the first metal mask removes the additional exposed part of the encapsulation material to form an additional contact opening to the logic semiconductor die,
    the method further comprising:
    forming an electrically conductive material in the additional contact opening.

2. The method of claim 1, wherein the pressurized stream of liquid is directed toward the first surface of the encapsulation material with the first metal mask over multiple periods of time with intervening inspection intervals for determining if the first terminal of the semiconductor die is exposed.

3. The method of claim 1, wherein the pressurized stream of liquid is directed toward the first surface of the encapsulation material with the first metal mask over an uninterrupted period of time selected to account for a thickness of the encapsulation material over the first side of the semiconductor die plus tolerance.

4. The method of claim 1, further comprising:
    inspecting the first surface of the encapsulation material with the first metal mask while the pressurized stream of liquid is being directed toward the first surface, to determine when the first terminal of the semiconductor die is exposed.

5. The method of claim 1, wherein the semiconductor die is a power semiconductor die, wherein the first terminal is a first power terminal, and wherein the power semiconductor die has a second power terminal at a second side of the power semiconductor die opposite the first side, the method further comprising:
    forming a second metal mask on a second surface of the encapsulation material opposite the first surface, the second metal mask being positioned over the second side of the power semiconductor die and exposing a second part of the encapsulation material aligned with the second terminal of the power semiconductor die;
    directing a pressurized stream of liquid toward the second surface of the encapsulation material with the second metal mask, to remove the second exposed part of the encapsulation material and form a second contact opening to the second terminal of the power semiconductor die; and
    forming an electrically conductive material in the second contact opening.

6. The method of claim 5, wherein the power semiconductor die has a control terminal at the first side of the power semiconductor die, wherein the first metal mask exposes a third part of the encapsulation material aligned with the control terminal of the power semiconductor die, and wherein the pressurized stream of liquid directed toward the first surface of the encapsulation material with the first metal mask removes the third exposed part of the encapsulation material to form a third contact opening to the control terminal of the power semiconductor die, the method further comprising:
    forming an electrically conductive material in the third contact opening.

7. The method of claim 5, wherein the power semiconductor die has a control terminal at the first side of the power semiconductor die, the method further comprising:
    laser drilling one or more additional contact openings into the first surface of the encapsulation material and which expose the control terminal of the power semiconductor die; and
    forming an electrically conductive material in the one or more additional contact openings.

8. The method of claim 1, further comprising:
    laser drilling one or more additional contact openings into the first surface of the encapsulation material and which extend to the logic semiconductor die; and
    forming an electrically conductive material in the one or more additional contact openings.

9. The method of claim 1, further comprising:
    forming an opening which extends completely through the encapsulation material by using a water jet etching process.

10. The method of claim 1, wherein the first metal mask has an opening over a section of the encapsulation material which is laterally spaced apart from the semiconductor die, and wherein the pressurized stream of liquid directed toward the first surface of the encapsulation material etches at least partly through the section of the encapsulation material aligned with the opening in the first metal mask to form at least part of a via that extends from the first surface of the encapsulation material to a second surface of the encapsulation material opposite the first surface.

11. The method of claim 10, wherein the pressurized stream of liquid directed toward the first surface of the encapsulation material etches completely through the section of the encapsulation material aligned with the opening in the first metal mask to form the via that extends from the first surface of the encapsulation material to the second surface.

12. The method of claim 10, wherein the pressurized stream of liquid directed toward the first surface of the encapsulation material etches only partly through the section of the encapsulation material aligned with the opening in the first metal mask, the method further comprising:
  forming a second metal mask on the second surface of the encapsulation material, the second metal mask having an opening aligned with the opening in the first metal mask; and
  directing a pressurized stream of liquid toward the second surface of the encapsulation material with the second metal mask, to etch the encapsulation material from the second surface through the opening in the second metal mask and complete the via that extends from the first surface of the encapsulation material to the second surface.

13. The method of claim 1, wherein the first metal mask comprises copper.

14. The method of claim 1, wherein the encapsulation material is a non-conductive material of a printed circuit board.

15. A method, comprising:
  embedding a semiconductor die in an encapsulation material, the semiconductor die having a first terminal at a first side of the semiconductor die;
  forming a first metal mask on a first surface of the encapsulation material, the first metal mask being positioned over the first side of the semiconductor die and exposing a first part of the encapsulation material aligned with the first terminal of the semiconductor die;
  directing a pressurized stream of liquid toward the first surface of the encapsulation material with the first metal mask, to remove the first exposed part of the encapsulation material and form a first contact opening to the first terminal of the semiconductor die; and
  forming an electrically conductive material in the first contact opening,
  wherein the first metal mask has an opening over a section of the encapsulation material which is laterally spaced apart from the semiconductor die,
  wherein the pressurized stream of liquid directed toward the first surface of the encapsulation material etches at least partly through the section of the encapsulation material aligned with the opening in the first metal mask to form at least part of a via that extends from the first surface of the encapsulation material to a second surface of the encapsulation material opposite the first surface.

16. The method of claim 15, wherein the pressurized stream of liquid directed toward the first surface of the encapsulation material etches completely through the section of the encapsulation material aligned with the opening in the first metal mask to form the via that extends from the first surface of the encapsulation material to the second surface.

17. The method of claim 15, wherein the pressurized stream of liquid directed toward the first surface of the encapsulation material etches only partly through the section of the encapsulation material aligned with the opening in the first metal mask, the method further comprising:
  forming a second metal mask on the second surface of the encapsulation material, the second metal mask having an opening aligned with the opening in the first metal mask; and
  directing a pressurized stream of liquid toward the second surface of the encapsulation material with the second metal mask, to etch the encapsulation material from the second surface through the opening in the second metal mask and complete the via that extends from the first surface of the encapsulation material to the second surface.

* * * * *